United States Patent
Ogura et al.

(10) Patent No.: US 8,462,288 B2
(45) Date of Patent: Jun. 11, 2013

(54) CABLE HOLDING STRUCTURE AND CABLE HOLDING METHOD

(75) Inventors: Kenji Ogura, Osaka (JP); Yuki Kita, Osaka (JP); Akihiro Fujikawa, Osaka (JP); Hideo Yonezawa, Osaka (JP); Tsukasa Fujimoto, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 320 days.

(21) Appl. No.: 12/841,637

(22) Filed: Jul. 22, 2010

(65) Prior Publication Data

US 2011/0043722 A1 Feb. 24, 2011

(30) Foreign Application Priority Data

Jul. 23, 2009 (JP) ................................ 2009-172247

(51) Int. Cl.
*G02F 1/1333* (2006.01)

(52) U.S. Cl.
USPC .......................................................... 349/58

(58) Field of Classification Search
USPC .......................................................... 349/58
See application file for complete search history.

(56) References Cited

U.S. PATENT DOCUMENTS

2005/0115735 A1* 6/2005 Iwai ............................. 174/68.1

FOREIGN PATENT DOCUMENTS

| JP | 3107003 U | 11/2004 |
| JP | 2005-130097 | 5/2005 |

* cited by examiner

*Primary Examiner* — Timothy L Rude
(74) *Attorney, Agent, or Firm* — Morgan, Lewis & Bockius LLP (57) ABSTRACT

A cable holding structure including a plurality of ribs 51 (52) stand on an inner surface of a housing 3, and holing cables 41, 43, wherein the ribs 51 (52) are arranged on a closed figure formed on the inner surface of the housing 3 at predetermined gaps (50) between the neighboring ribs 51 (52).

16 Claims, 8 Drawing Sheets

CABLE HOLDING STRUCTURE AND CABLE HOLDING METHOD

This application is based on Japanese Patent Application No. 2009-172247 filed on Jul. 23, 2009, the contents of which are hereby incorporated by reference.

BACKGROUND OF THE INVENTION

1. Field of the Invention

The present invention relates to a cable holding structure and a cable holding method for safely holding cables connected to boards and electronic components arranged inside a liquid crystal television receiver and the like.

2. Description of Related Art

Conventionally, multiple boards, and components such as speakers, sensors, and LEDs are arranged in a television receiver, which is an example of an electronic device. Cables are used to connect between the multiple boards, and between the board and the component such as the speaker, the sensor, and the LED, which are often installed at separate locations.

When a large force such as a vibration and a shock is applied to the television receiver, the cables may be pulled by the force, and may be damaged or disconnected. Moreover, the boards, the components, and the like to which the cables are connected are strongly pulled by the cables, and may be damaged.

The cables are thus arranged in a loose state (in a state where the cables have a slack in length) in the television receiver. When the cables arranged in the loose state are pulled, a tension is not generated for the cables, namely a force is distributed, in a period from the loose state to the stretched state. As a result, forces acting on the cables themselves, and/or the boards and/or the components to which the cables are connected are reduced.

On the other hand, multiple members formed by cutting and bending a metal plate (namely sheet metal) through a press process are often provided in the television receiver. A cut surface of the member formed by cutting and bending the metal plate often has a sharp cross section (sharp edge). Since the cables have the slack in length, the cables thus often move in the television receiver when the television receiver is transported or moved. On this occasion, the cables may be moved so as to be rubbed against the sharp edge.

When the cable is rubbed against the sharp edge, a coating of the cable may be damaged resulting in an electrical defect such as a short circuit or an electric leak, or the cable is disconnected. Moreover, an electronic component reaching to a high temperature may be installed in the television receiver, and when the cable comes in contact with the hot electric component, the insulation coating covering the outside of the cable may be removed, resulting in a short circuit or an electric leak. When the cable is short-circuited, generates an electric leak, or is disconnected, an operation of the television receiver encounters a problem.

Lock portions for locking cables are provided in a cabinet of a television receiver as described in Japanese Patent Application Laid-Open No. 2005-130097, and Japanese Examined Utility Model Registration No. 3107003. A defect such as a disconnection, an electric leak, and a short-circuit caused by a movement of the cables is prevented by engaging the cables to the lock portions provided inside the cabinet, thereby restraining the cables from moving.

Moreover, a front cabinet and a rear cabinet of the television receiver are independently manufactured, and are transported to another location (final assembly plant), which is different from locations of manufacturing. Then, they are assembled together with an image display device (such as an LCD and a PDP) transported independently, resulting in a final television receiver. Different boards, components, and the like are installed on the front and rear cabinets, and the front and rear cabinets are transported as semi-assembled cabinets.

When the semi-assembled front and rear cabinets are transported, end portions of the cables attached to the boards and/or the components can move freely. When the semi-assembled front cabinet and/or the semi-assembled rear cabinet are transported, the cables and/or connectors attached to the ends of the cables may present a rough motion, resulting in scratches on a decoration surface of an outer surface of the front and rear cabinets, and damages of the boards and components.

When the semi-assembled cabinets are transported, a method including: providing lock portions; and transporting the cabinets while the cables are locked to the lock portions as disclosed in Japanese Patent Application Laid-Open No. 2005-130097, and Japanese Examined Utility Model Registration No. 3107003, or a method including: fixing the cables and/or connectors to the front and rear cabinets using adhesive tapes; and transporting is employed.

However, even if the common cabinets are used in the television receivers, different boards and electronic components may be mounted, and the number and thickness of wires of the cables may differ depending on the boards and electronic components. When different types of cables (thickness and number) are used, there may be cables which cannot be locked by the lock portion described in Japanese Patent Application Laid-Open No. 2005-130097, and Japanese Examined Utility Model Registration No. 3107003, and the cables may not be held during the transport and/or the assembly.

Moreover, the lock portions described in Japanese Patent Application Laid-Open No. 2005-130097, and Japanese Examined Utility Model Registration No. 3107003 serve to hold extra portions of the cables in the finished television receiver. The lock portions may be provided to be intended to lock cables which are different from cables connected to the boards and/or components attached the cabinet on which these lock portions are formed. As a result, when the semi-assembled cabinets are transported, the cables attached to the boards and components attached to the cabinets cannot be locked by the lock portions. Therefore, the locking by the lock portions needs to be given up, or lock portions for locking the cables during the transport need to be additionally provided.

When an adhesive tape is used for attachment, an adjustment may be made depending on how the adhesive tape is adhered, and it is thus possible to prevent the cables and connectors themselves from being damaged, or other components from being damaged by contact of the cables and connectors. However, the attachment by the adhesive tape may leave an adhesive portion on a member, resulting grime and the like.

SUMMARY OF THE INVENTION

In view of the foregoing problems, it is an object of the present invention to provide a cable holding structure and a cable holding method for easily holding cables and connectors different in thickness and number of cables.

A cable holding structure according to an aspect of the present invention holds a cable arranged inside a housing of an electronic device, and includes multiple ribs elected on an inner surface of the housing of the electronic device. The multiple ribs are arranged with a gap between neighboring ribs having a predetermined width so as to form a closed figure on the inner surface of the housing of the electronic device.

According to this configuration, since the multiple ribs are arranged on the closed figure with the predetermined gap, multiple cables different in the extending directions of the cables can be held without applying stress on the cables. Moreover, since the multiple ribs are arranged on the closed figure, a space enclosed by the multiple ribs is formed. Therefore, it is possible to push cables into the space to hold the cable, and the cables can be easily held and removed.

As a result, it is possible to restrain the defects that the cable and the connector attached to an end of the cable move (roughly move), the cable and/or the connector itself is damaged, a decoration surface of a housing of an electronic device is scratched, and boards and components are broken.

Further, since cables can be held independently of an extending direction thereof, one cable holding structure can be shared even if cables to be held during the transport of the housing of the electronic device are different from cables to be held at final assembly of the electronic device. Moreover, by providing the multiple ribs, and also providing the multiple gaps between neighboring ribs, multiple types of cables can be simultaneously held by the common cable holding structure. The employment of the cable holding structure can reduce waste, resulting in reductions of time, labor, and cost required for the manufacturing.

According to a preferred aspect of the present invention, the closed figure includes at least one straight portion, and at least a rib arranged on the straight portion out of the plurality of ribs is provided with a reinforcement rib which crosses an outer wall surface of the closed figure, and protrudes from the inner surface of the housing Since the straight rib tends to fall down due to its structure, it may be broken or bent by a pulling force of a held cable. Thus, the reinforcement rib is formed, and the breakage and bend can be restrained. Therefore, a cable can be stably held, even if the cable is wound tightly around the cable holding unit.

According to a preferred aspect of the present invention, the closed figure may be a quadrangle, and the multiple ribs may include at least corner ribs arranged at four corners. The multiple ribs may include at least one intermediate rib arranged between the corner ribs. The quadrangle may be a rectangle, and the cable holding structure may include a pair of the intermediate ribs that are arranged on both longer sides of the rectangle, and are formed to oppose each other. Further, all the four corner ribs may have the same shape.

The corner ribs are provided as ribs, and the cross sectional shape of the corner rib is an L shape. The employment of the L-shaped ribs enables to form a strong structure against bending and breakage, resulting in a strong cable holding unit. Moreover, since the cable holding unit includes the intermediate rib, the size of the each rib can be reduced, thereby increasing the strength against the bending and breakage of the ribs. Moreover, the increase in the number of the ribs increases the number of gaps between neighboring ribs, the number of winding methods for attaching the cable can be increased, and also the number of cables to be simultaneously held can be increased. Further, the rectangular arrangement facilitates the operation of attaching the cables.

According to a preferred aspect of the present invention, the closed figure may be circular, and the plurality of ribs may have the same shape, and may be arranged on a same circumference at equal intervals in the circumferential direction.

According to a preferred aspect of the present invention, the gap between neighboring ribs may have at least two types of widths. The cable may vary in thickness depending on a current or a signal to be flown therethrough. In this case, if the cable is thinner than the gap, the cable holding structure cannot firmly hold the cable, and if the cable is thicker, the cable is pressed, and may be damaged upon attachment/detachment. Since at least two types of widths are provided, cables are attached to gaps according to the thickness of cables, resulting in easily and safely holding the cable.

A liquid crystal television receiver is an example of an electronic device having the above-mentioned cable holding structure on a front cabinet.

The cables may be clamped and held in the gaps formed between the multiple ribs. On this occasion, the cable may be held along the ribs in a zigzag manner, and the cable may be clamped in the gap so that the cable is folded back outside the closed figure.

A bent portion may be formed by bending the cable, and the bent portion may be stored and held in a space surrounded by the multiple ribs.

The cable may be held by storing a connector provided at an end of the cable in a space surrounded by the multiple ribs. Moreover, the connector may be held such that at least a part of the connector is disposed outside the space surrounded by the multiple ribs.

DETAILED DESCRIPTION OF PREFERRED EMBODIMENTS

Figure 1:
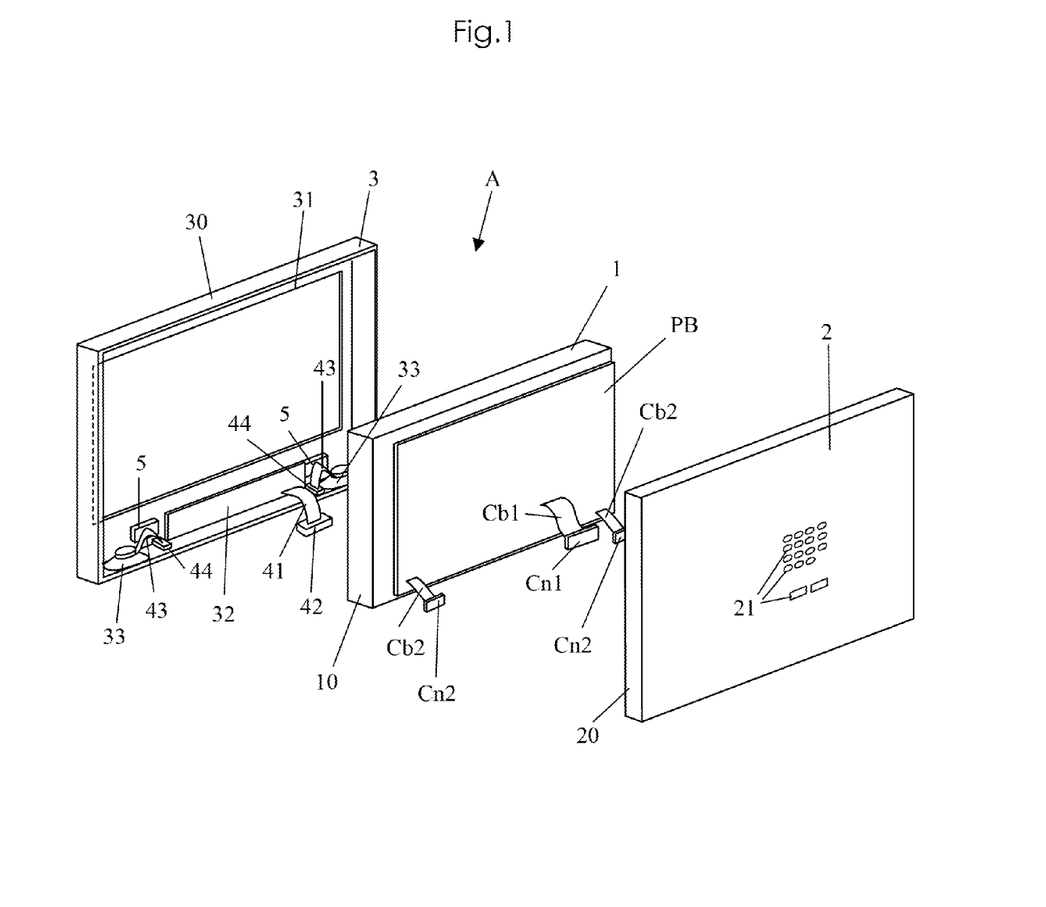
FIG. 1 is a perspective view of a state in which a front cabinet and a rear cabinet of a liquid crystal television receiver is disassembled.

A description will now be given of an embodiment of the present invention referring to drawings. FIG. 1 is a perspective view of a state in which a front cabinet and a rear cabinet of a liquid crystal television receiver is disassembled.

As shown in FIG. 1, the liquid crystal television receiver A includes a liquid crystal display unit 1, a rear cabinet 2 which covers a rear side of the liquid crystal display unit 1, and a front cabinet 3 which covers a front side of the liquid crystal display unit 1. Moreover, a stand, which is not shown, is attached to the rear cabinet 2. Both the front cabinet 1 and the rear cabinet 2 are molded resin products.

The liquid crystal display unit 1 is an image display device including a liquid crystal panel, and includes a metal frame 10 in a cuboid shape surrounding the liquid crystal panel. The frame 10 is provided with an image display portion on a front surface, and a printed board PB used for controlling an operation of the liquid crystal television receiver A is attached and fixed to the rear surface.

The rear cabinet 2 includes a rectangular rear surface, and is provided with sidewalls 20 stand on an outer edge of the rectangle toward a front surface. Moreover, multiple terminal holes 21 for exposing ends of external connection terminals (not shown) provided on the printed board PB are formed on the rear surface.

The front cabinet 3 has a rectangular shape which is horizontally long viewed from front, and is provided with sidewalls 30 stand on an outer edge toward a rear surface. A rectangular opening 31 is formed at a center portion of the front cabinet 3, and the liquid crystal display unit 1 is disposed and fixed so that the image display portion of the liquid crystal display unit 1 can be seen from the opening 31. There is a space at a lower portion of the front cabinet 3, and a board 32 is attached at the center of the lower portion on the rear surface side, and two speakers 33 are attached at both left and right end portions of the lower portion respectively. Switches, display LEDs, and sensors are mounted on the board 32.

A cable 41 is attached to the board 32 connected with the printed board PB mounted on the rear surface of the liquid crystal display unit 1 for transmitting/receiving signals, and a connector 42 is provided at an end of the cable 41. Moreover, cables 43 connected with the printed board PB for supplying a drive power of the speakers are similarly attached to the speakers 33, and a connector 44 is provided at an end of the cables 43.

Cable holding units (cable holding structures) 5 formed integrally with the front cabinet 3 are provided on the rear surface side of the front cabinet 3 as shown in FIG. 1. Though the cable holding units 5 are formed between the board 32 and the speakers 33, the locations are not limited to this case, but the cable holding units 5 may be formed at locations in a free space of the front cabinet 3 and where the cables are easily attached. Moreover, though the cable holding units 5 hold the cables 43 in the television receiver A shown in FIG. 1, the cables to be held are not limited to the cables 43, but the cable holding units 5 may hold the cable 41 or other cables which are not shown.

Figure 2:
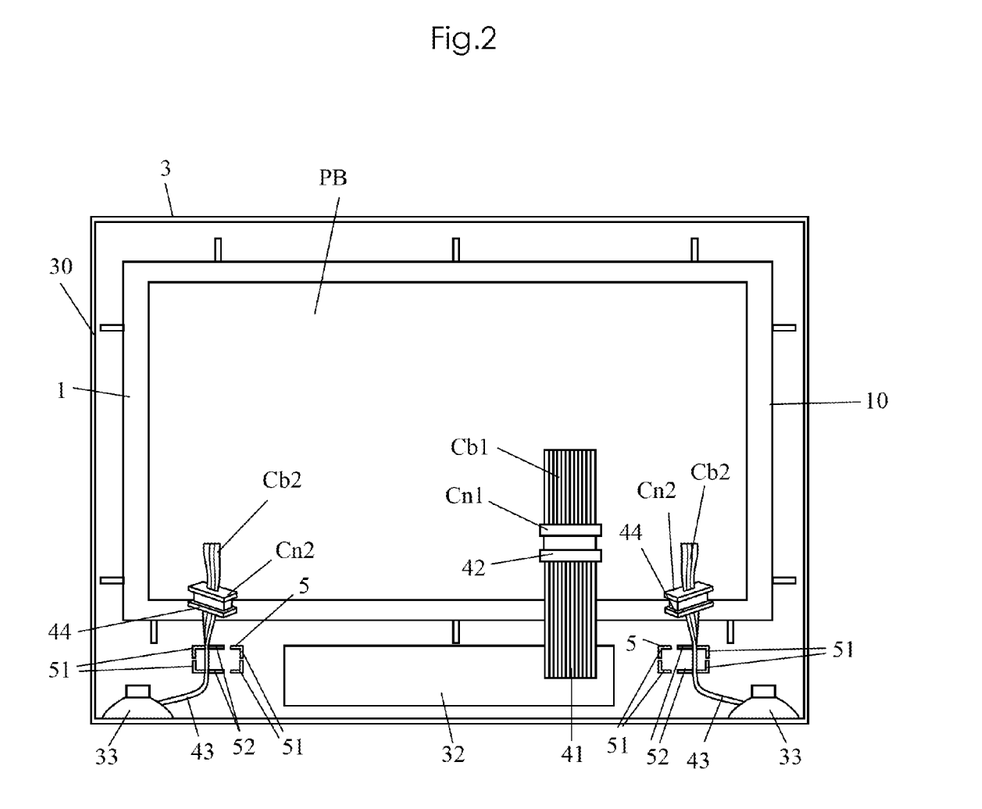
FIG. 2 is a perspective view enlarging a part of the front cabinet on which cable holding structures according to the present invention are formed.

A description will now be given of an arrangement of the liquid crystal display unit 1 and the front cabinet 3 referring to drawings. FIG. 2 is a view of a state in which the liquid crystal display unit is attached to the front cabinet, and which is seen from the rear surface side. The liquid crystal display unit 1 is arranged at a little higher portion on the front cabinet 3 as shown in FIG. 2. The liquid crystal display unit 1 is fixed to the front cabinet 3 by screwing. The liquid crystal display unit 1 is positioned by bringing the sidewalls in contact with multiple positioning ribs formed on the front cabinet 3. The liquid crystal display unit 1 is positioned at a proper location on the front cabinet 3, and a user can consequently view an image displayed on the image display portion of the liquid crystal display unit 1 via the opening 31 of the front cabinet 3.

The printed board PB disposed on the rear surface of the liquid crystal display unit 1 is provided with cables Cb1, Cb2, and connectors Cn1, Cn2 are attached to ends of the cables Cb1, Cb2 respectively. After the liquid crystal display unit 1 is disposed on the rear surface of the front cabinet 3, the connector 42 at the end of the cable 41 disposed on the board 32 arranged on the front cabinet 3 and the connector Cn1 at the end of the cable Cb1 are connected to each other, and the connectors 44 at the end of the cables 43 disposed on the speakers 33 and the connectors Cn2 disposed at the end of the cables Cb2 are connected to each other.

The cables 41, 43 and the cables Cb1, Cb2 are connected to each other so as to provide a play (slack). As a result, even if the cables 41, 43, Cb1, and Cb2 are pulled, they are deformed to become tense, and it is possible to restrain a large force from acting on the connectors 42, 44, Cn1, and Cn2, the board 32, the speakers 33, and the printed board PB.

The cable 41 can be connected to the cable Cb1 of the printed board PB without a twist on the rear surface side of the front cabinet 3 as shown in FIG. 2, and thus can be shortened compared with the cables 43 for the speakers 33. On the other hand, the speakers 33 are attached on the sidewall 30 so as to face downward, and it is necessary to form a twist for connecting the cables 43 and the cables Cb2 with each other. The cables 43 and the cables Cb2 thus have sufficient lengths for decreasing a load resulting from the twist.

FIG. 1 is now referred to again. The rear cabinet 2 is attached to the rear surface side of the front cabinet 3 to which the liquid crystal display unit 1 is attached as shown in FIG. 1. The rear cabinet 2 is attached so that the sidewalls 30 of the front cabinet 3 and the sidewalls 20 of the cabinet 2 overlap in front and rear direction, and the external connection terminals mounted on the printed board PB attached on the rear surface side of the liquid crystal display unit 1 are exposed from the terminal holes 21. It should be noted that the front cabinet 3 and the rear cabinet 2 are fixed to each other by a method which enables easy attachment and detachment, and firm fixing. Screws are used here for the fixing.

After the rear cabinet 2 is placed at a proper position of the front cabinet 3, the rear cabinet 2 is pressed and fixed to the front cabinet 3 by screwing. On this occasion, a rib for pressing the liquid crystal display unit 1 is provided on the rear cabinet 2. Gaps are formed for avoiding the cables 41, 43 and/or the cables Cb1, Cb2 on this rib.

The cable 41 and the cable Cb1 are connected to each other without a twist, and the center thereof is hardly displaced, and they thus hardly come out from the gap on the rib provided for avoiding the cable. On the other hand, the cables 43 and the cables Cb2 are connected to each other with a twist, and the twist causes the center of the cable to bend, resulting in a possible displacement from the gap used for avoiding the cable. The cables may be pinched between the sidewall 30 of the front cabinet 3 and the sidewall 20 of the rear cabinet 2, or pinched between the rib of the rear cabinet 2 and the liquid crystal display unit 1 depending on how the rear cabinet 2 is attached.

Therefore, the cables 43 are held by the cable holding units 5 in order to avoid a defect that the cables 43 and/or the cables Cb2 are pinched by a part of the rear cabinet 2 from occurring when the rear cabinet 2 is attached. Since the cables 43 are held by the cable holding units 5, cables 43 and the cables Cb2 can be accommodated within a predetermined location, thereby restraining the defect that the cables are pinched by the rib. Moreover, the cable 43 held by the cable holding unit 5 can be easily detached from the cable holding unit 5 when the cable 43 is pulled, and a stress generated when the cable 43 and/or the cable Cb2 is pulled thus can be reduced.

The liquid crystal television receiver is manufactured through multiple manufacturing processes, and multiple semi-assemblies are transported to a location of final assembly (plant), and the semi-assemblies which have been transported are combined into a final assembly. For example, a location of assembly in an early process is determined based on availability of each of the components and cost of the assembly, and the location of the final assembly is selected to a location close to a market to which the final product is delivered.

As for the liquid crystal television receiver according to the present invention, the liquid crystal display unit 1, the rear cabinet 2, the front cabinet 3, and the stand are independently transported from the locations of assembly in the early process. The front cabinet 3 is transported in a state in which the board 32 and the speakers 33 are assembled thereto at the location of assembly in the early process.

By attaching the board 32 and the speakers 33 to the front cabinet 3, the cable 41 and the connector 42 provided for the board 32, and the cables 43 and the connectors 44 provided for the speakers 33 are attached integrally with the front cabinet 3. When only the front cabinet 3 is transported, the cables 41, 43 and the connectors 42, 44 are in a free state, and the cables 41, 43 and the connectors 42, 44 thus tend to move (move roughly).

As a result of the (rough) movement of the cables 41, 43 and the connectors 42, 44, they come in contact with the front surface side of the front cabinet 3, and may damage the front cabinet 3. Moreover, the cables may be caught by a jig used for fixing the front cabinet 3 or the like, and a defect that the coating thereof is removed, or the cables are disconnected may occur. The cables 41, 43 are thus held by the cable holding units 5 provided on the front cabinet 3, thereby restraining the cables 41, 43 and the connectors 42, 44 from moving roughly.

Figure 3:
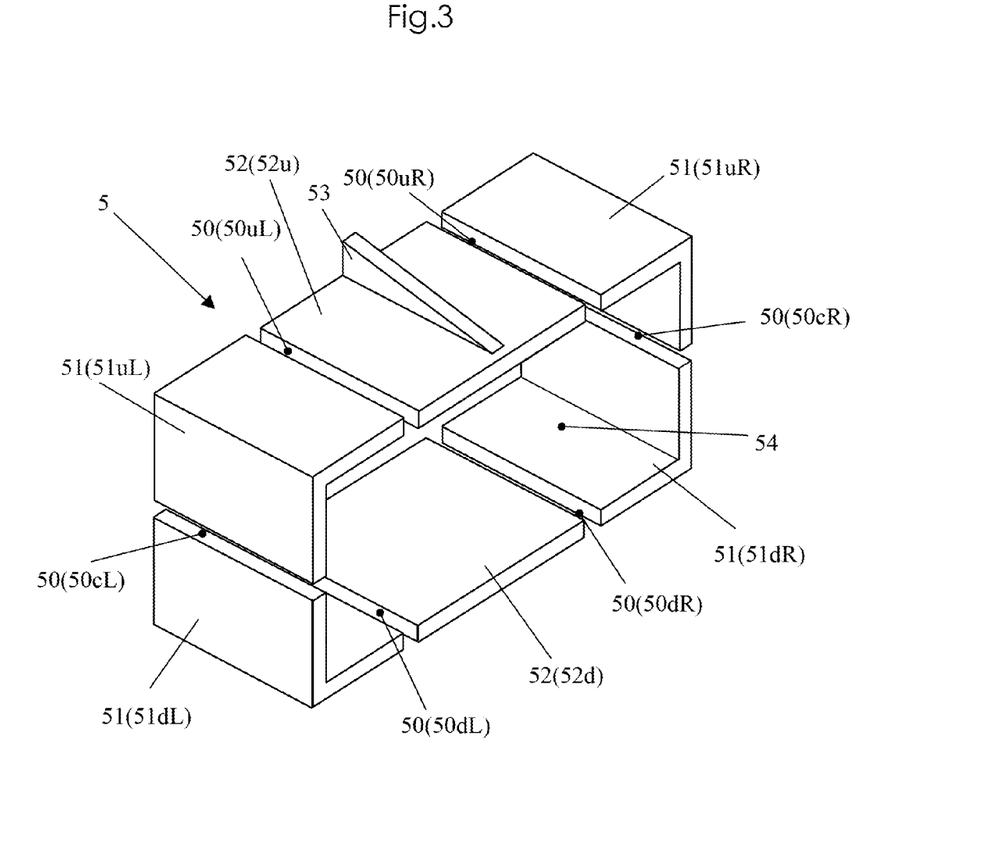
FIG. 3 is an enlarged view showing the cable holding structure.

A description will now be given of the detail of the cable holding unit 5 provided on the front cabinet 3 referring to drawings. FIG. 3 is an enlarged perspective view showing an example of the cable holding structure according to the present invention, and FIG. 4 is a plan view of the cable holding structure shown in FIG. 3.

Figure 4:
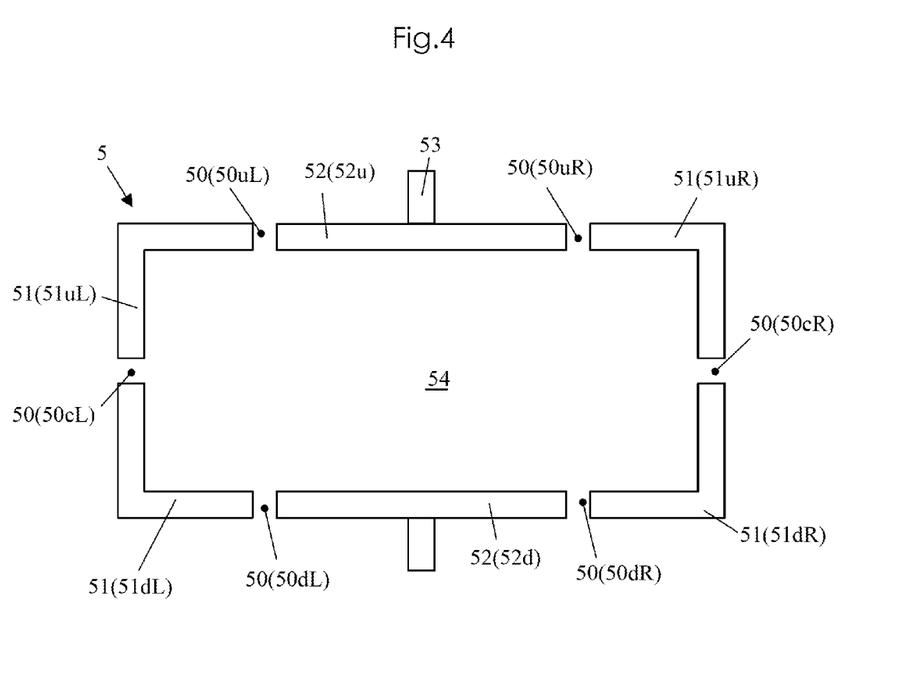
FIG. 4 is a plan view of the cable holding structure shown in FIG. 3.

The cable holding unit 5 includes four corner ribs 51 provided at four corners, and having a cross section in an L shape, and a pair of intermediate ribs 52 having a flat plate shape, and disposed so as to face each other as shown in FIG. 3, and FIG. 4. The corner ribs 51 are disposed at positions corresponding to four corners of a rectangle. At each shorter side of the rectangle, the corner ribs 51 are arranged adjacently to each other. At each longer edge, the intermediate rib 52 is disposed between the corner ribs 51. Further, on each of the intermediate ribs 52, is formed a reinforcement rib 53 which is formed integrally with a surface of each intermediate rib 52 opposite to a surface facing the other intermediate rib 52, and which is formed integrally with the front cabinet 3. Though all the corner ribs 51 have the same shape, and the pair of intermediate ribs 52 have the same length, they are not limited to this configuration.

Then, gaps (slits 50) are formed between the corner ribs 51, and between the corner rib 51 and the intermediate rib 52. A holding portion 54 in a cuboid shape surrounded by the four corner ribs 51 and the pair of intermediate ribs 52 is formed on the cable holding unit 5. The widths of all the slits 50 of the cable holding unit 5 are the same, and are such widths as, when cables are placed, clamping resin coatings which cover the cables, and holding the cables by friction.

In the following description, the upper corner ribs, intermediate rib and slits are denoted by a suffix u, the lower corner ribs, intermediate rib and slits are denoted by a suffix d, and the center slits are denoted by a suffix c. Moreover, the left side is denoted by L, and the right side is denoted by R. Then, the upper left corner rib is denoted by 51$u$L, and the left center slit is denoted by 50$c$L, for example. In the following section, the suffix is appended according to the same rule (refer to FIG. 3, FIG. 4).

A description will now be given of an example of a method of holding cables by cable holding structures referring to drawings. FIG. 5A to FIG. 5F show states in which a cable holding unit, which is an example of the cable holding structure according to the present invention, holds a cable. FIG. 5A to FIG. 5F are diagrams showing states in which the cable holding unit shown in FIG. 3 holds the cable in different ways.

Figure 5A:
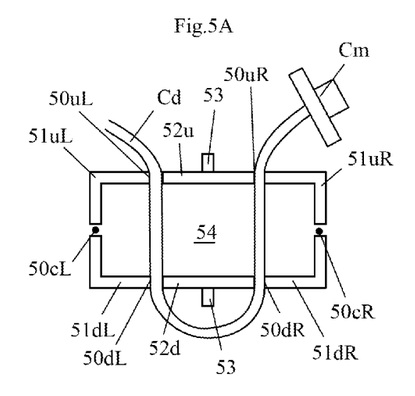
FIG. 5A shows a state in which the cable holding unit shown in FIG. 3 holds a cable in a different method.

The cable holding unit 5 shown in FIG. 5A holds one cable (one bundle of cables) Cd. The cable Cd may be the cable 41 attached to the board 32, the cable 43 attached to the speaker 33, either one of the cables Cb1, Cb2 attached to the printed board PB, or another cable which is not shown.

In the cable holding unit 5, the cable Cd passes downward a slit 50$u$L between the upper left corner rib 51$u$L and the upper intermediate rib 52$u$, and passes downward a slit 50$d$L between the lower left corner rib 51$d$L and the lower intermediate rib 52$d$. Then, the cable Cd turns around at below the lower intermediate rib 52$d$, passes upward a slit 50$d$R between the lower right corner rib 51$d$R and the lower intermediate rib 52$d$, and passes upward a slit 50$u$R between the upper right corner rib 51$u$R and the upper intermediate rib 52$u$.

The cable Cd is held by the cable holding unit 5 as described above. The length of the cable Cd is adjusted by folding back, and a connector Cm is disposed close to the upper right corner rib 51$u$R and the upper intermediate rib 52$u$ of the cable holding unit 5. By arranging the connector Cm close to the cable holding unit 5 as described above, it is possible to restrain the cable Cd and the connector Cm from roughly moving when the front cabinet 3 is transported, and a vibration or an impact is input, resulting in restraint of defects such as a damage of the cable Cd and the connector Cm themselves, and a scratch and a damage caused by a contact with the connector Cm. Though the fold-back of the cable Cd is disposed at below the lower intermediate rib 52$d$ in the example shown in FIG. 5A, the fold-back is not limited to this position. The cable Cd may be disposed upside down so that the cable Cd is folded back at above the upper intermediate rib 52$u$.

Figure 5B:
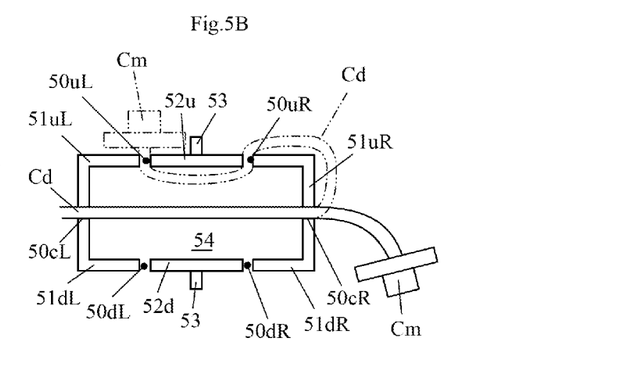
FIG. 5B shows a state in which the cable holding unit shown in FIG. 3 holds the cable in a different method.

A description will now be given of a different method for holding the cable referring to FIG. 5B. The cable holding unit 5 holds one cable (one bundle of cables) Cd as shown in FIG. 5B. The cable Cd is arranged so as to pass, from left to right, a slit 50$c$L between the upper left corner rib 51$u$L and the lower left corner rib 51$d$L, and a slit 50$c$R between the upper right corner rib 51$u$R and the lower right corner rib 51$d$R. The cable Cd is then folded back to above at the right side of the cable holding unit 5, and the connector Cm is disposed close to the cable holding unit 5. The cable Cd is arranged straight, and is thus easily attached to the cable holding unit 5, resulting in a reduction in labor.

Moreover, a portion of the cable Cd from the fold-back to an end may be attached to the slit 50$u$R between the upper right corner rib 51$u$R and the upper intermediate rib 52$u$, and the slit 50$u$L between the upper left corner rib 51$u$L and the upper intermediate rib 52$u$, so as to pass around the corner ribs 51$u$R, 51$u$L, and the intermediate rib 52$u$. By using the cable holding unit 5, the extra portion on the end side of the cable Cd can further be held, and it is possible to efficiently restrain the cable Cd and/or the connector Cm from roughly moving. The cable Cd may be arranged from left to right, and may be folded back downward.

The cable Cd passes the slits 50cL 50cR arranged on the straight line, and it is thus possible to reduce the labor and time for attaching the cable Cd to the cable holding unit 5.

A description will now be given of a further different method for holding a cable referring to FIG. 5C. The cable holding unit 5 holds one bundle of cables Cd in the example shown in FIG. 5C. The cables Cd are folded back in the middle, and a fold-back portion is held by the holding portion 54 surrounded by the four corner ribs 51 and the pair of intermediate ribs 52 of the cable holding unit 5. The connector Cm attached to the end of the cables Cd is then disposed outside the cable holding unit 5. The corner ribs 51 and the intermediate ribs 52 are elastically deformable members, and when the cables Cd are pressed thereinto, each of the ribs is pushed thereby to elastically clamp the cables Cd. As a result, the cables Cd are firmly held so as to prevent the cables Cd being pulled out from the cable holding unit 5.

By holding the cables Cd using the cable holding unit 5 without catching the cables Cd in the slit 50 in this way, it is possible to restrain the cables Cd from being entwined with the corner rib 51 and/or the intermediate rib 52, and becoming difficult to be removed when the cables are to be detached from the cable holding unit 5. As a result, it is possible to prevent generation of defects such as a disconnection of the cables Cd themselves, a damage of an attached portion of the cables Cd due to an excessive force applied thereto, and a damage of the cable holding unit 5 since the cables Cd are pulled excessively.

The cable holding unit 5 can provide different holding method for the transport of the front cabinet 3 and the members attached to the front cabinet 3, and for the finished product. In other words, it is preferred that the cables Cd are securely held when the front cabinet 3 is transported, and also the cables Cd are easily and safely removed. The cables Cd are folded back, and are held in the holding portion of the cable holding unit 5, for example, as shown in FIG. 5C. Then, it is preferred that the cables are not removed by a little force so that a rough motion is prevented inside the liquid crystal television receiver during the final assembly. The cables Cd may then be placed and held in the slits 50 as shown in FIG. 5A, FIG. 5B.

By using the cable holding unit 5 in this way, the cables Cd can be held in a proper holding method during both the temporal holding and longtime holding.

A description will now be given of a further different method for holding a cable referring to FIG. 5D. The cable holding unit 5 holds the connector Cm attached to the end of the cable Cd as shown in FIG. 5D. The connector Cm is engaged with and disposed in the holding portion 54 surrounded by the four corner ribs 51 and the pair of intermediate ribs 52. The connector Cm is held by the corner ribs 51 and/or intermediate ribs 52 so as not to be pulled out.

By directly holding the connector Cm by the cable holding unit 5 in this way, the rough motion of the connector Cm can be surely restrained. Since the rough motion of the connector Cm that often causes scratches and damages generated during the transport of the front cabinet 3 can be restrained, defects such as scratches and damages can be restrained. When the liquid crystal television receiver is assembled, the cable Cb can be held by passing the cable Cb through the slits 50 and wound around the corner ribs 51 and/or the intermediate ribs 52 in order to prevent the cable Cb from moving roughly. The connector Cm may be completely fit into the holding portion 54 as shown in FIG. 5D, or the connector Cm may be arranged so that the lengthwise direction thereof forms a predetermined angle (right angle here) with respect to the front cabinet 3 (refer to FIG. 5E).

Figures 5C, 5D, 5E, 5F:
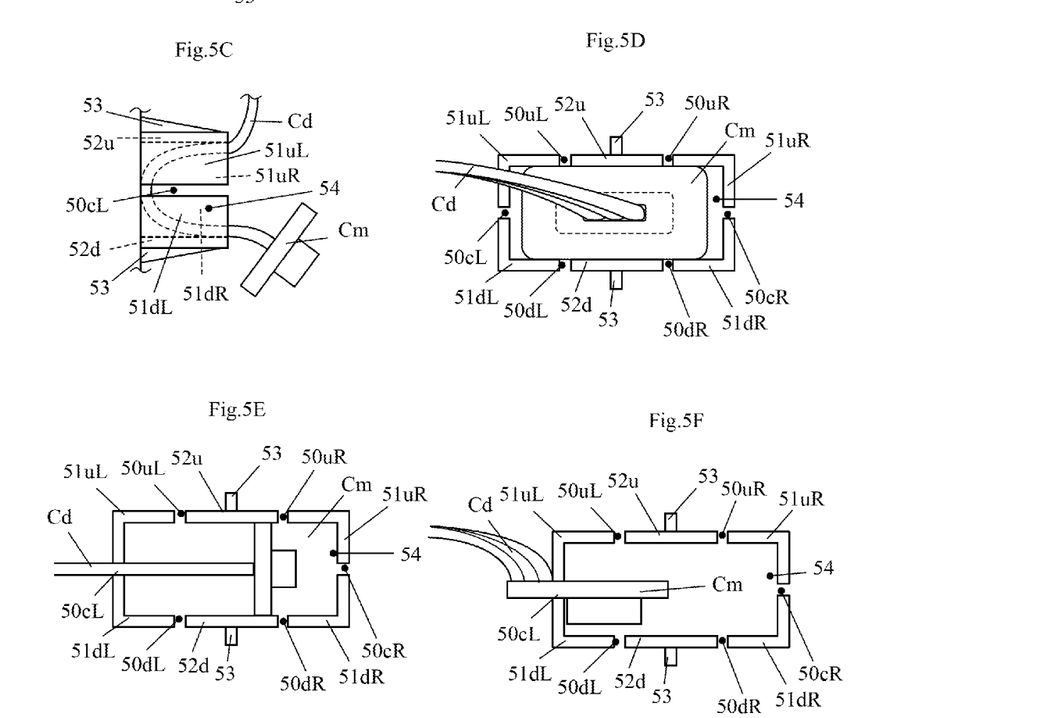
FIG. 5C shows a state in which the cable holding unit shown in FIG. 3 holds the cable in a different method.
FIG. 5D shows a state in which the cable holding unit shown in FIG. 3 holds the cable in a different method.
FIG. 5E shows a state in which the cable holding unit shown in FIG. 3 holds the cable in a different method.
FIG. 5F shows a state in which the cable holding unit shown in FIG. 3 holds the cable in a different method.

Moreover, the connector Cm may be clamped in the slit 50cL, and a part thereof is disposed inside the holding portion 54 as shown in FIG. 5F. By engaging a part of the connector Cm with the slit 50 in this way, the connector Cm can be stably held by the cable holding unit 5. As a result, the connector Cm tends not to roughly move during the transport of the front cabinet 3, and it is possible to restrain such a defect that the connector Cm itself breaks, and the connector Cm comes in contact with the front cabinet 3 and the components attached to the front cabinet 3, resulting in scratches or damages thereof. Though the slit 50cL between the upper left corner rib 51uL and the lower left corner rib 51dL is employed as a slit for holding the connector Cm, the slit is not limited to it. Moreover, the width of at least one of the slits 50 (50cL according to this embodiment) provided for the cable holding unit 5 may be made wider than other slits for holding the connector Cm for holding the connector Cm. The end of the cable Cd can be held by holding the connector Cm as shown in FIG. 5D to FIG. 5F. The cable Cd is also held as a result.

Figure 6:
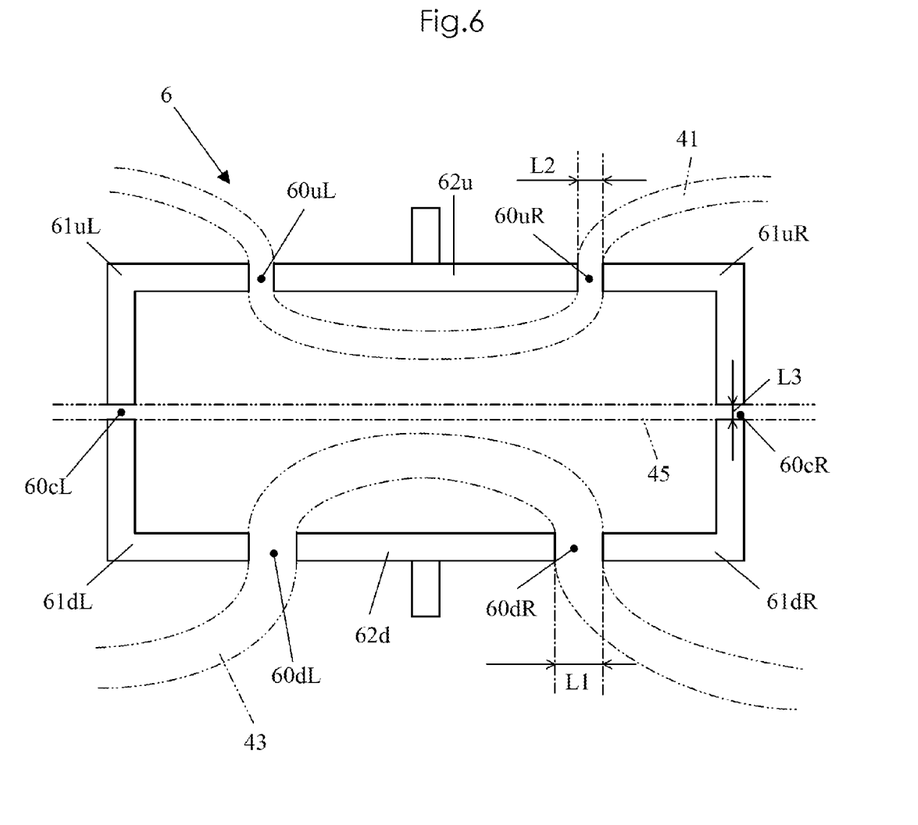
FIG. 6 shows another example of the cable holding structure according to the present invention.

A description will now be given of other examples of the cable holding structure according to the present invention referring to drawings. FIG. 6 shows another example of the cable holding structure according to the present invention. A cable holding unit 6 shown in FIG. 6 is attached on the rear surface side of the front cabinet of the liquid crystal television receiver, and the widths of the slits are different from those of the cable holding unit 5 shown in FIG. 4 and the like. Since it has substantially the same structure, other than the widths of the slits, as the cable holding unit 5, a detailed description of the substantially the same portions is thus omitted.

The cable holding unit 6 shown in FIG. 6 includes corner ribs at the four corners (upper left corner rib 61uL, upper right corner rib 61uR, lower left corner rib 61dL, and lower right corner rib 61dR), and intermediate ribs 62 (upper intermediate rib 62u and lower intermediate rib 62d) vertically opposed to each other, and provided between the upper corner ribs 61u (upper left corner rib 61uL and upper right corner rib 61uR) and between the lower corner ribs 61d (lower left corner rib 61dL and lower right corner rib 61dR).

Slits 60uL, 60uR are formed between the upper corner ribs 61uL, 61uR and the upper intermediate rib 62u. Similarly, slits 60dL, 60dR are formed between the lower corner ribs 61dL, 61dR and the lower intermediate rib 62d. Then, slits 60cL, 60cR are formed between the upper left corner rib 61uL and the lower left corner rib 61dL, and between the upper right corner rib 61uR and the lower right corner rib 61dR, respectively.

A detailed description will now be given of the respective slits. The cable holding unit 6 simultaneously holds the cable 41 provided for the board 32 in the upper side thereof, and the cable 43 attached to the speaker 33 in the lower side thereof during the transport of the front cabinet 3. Moreover, when the liquid crystal television receiver A is finally assembled, the cable holding unit 6 holds a cable 45 to be connected to another device while these cables are removed or are still held.

On this occasion, the cable 41 is fit into the slits 60uL, 60uR, the cable 43 is fit into the slits 60dL, 60dR, and the cable 45 is fit into the slits 60cL, 60cR. Since the cable 41, the cable 43, and the cable 45 are used for different purposes (different signals or different electric current) respectively, the thickness and the number of wires stored in the cable are different.

The cable 41 is attached to the front cabinet 3, and is provided for the board 32. The cable 41 is an electric wire for communication of signals such as a signal transmitting an operation of a switch provided on the board 32, and a signal for transmitting a reception of an input from a remote controller, and for flowing currents for driving electronic components such as switches, sensors, and LEDs consuming a low power. A flat cable which is formed by arranging a large number of electric wires with small diameter in a flat plate shape is used as the cable 41.

On the other hand, the cable 43 includes electric wires which provide an electric power (current) for driving the speaker 33. The electric power (current) larger than the electric power (current) for driving the electronic components described above is necessary for driving the speakers 33. Therefore, the cables 43 for flowing the electric power for driving the speakers 33 include thicker electric wires than the electric wires included in the cable 41. Moreover, the number of the electric wires is smaller than that of the cable 41.

The cable 45 is used to communicate signals between the printed board PB and other components. Though the cable 45 handles many signals, the cable 45 does not have wires for supplying an electric power for driving electronic components such as a switch and a sensor. The cable 45 is thus a flat cable provided with thinner electric wires compared with those of the cable 41.

Each of the slits holds each of the cables so that the cable is not easily removed, and there is the following relationship among a width L1, a width L2, and a width L3 of the slits 60dL, 60dR, the slits 60uL, 60uR, and the slits 60cL, 60cR. The width L1 of the slits 60dL, 60dR in which the cable 43, which is a thick cable, is fit, is formed wide. The width L3 of the slits 60cL, 60cR in which the cable 45, which is a thin cable, is fit, is formed narrow. The width L2 of the slits 60uL, 60uR in which the cable 41, which is thinner than the cable 43, and thicker than the cable 45, is fit, is formed so as to fall between the width L1 and the width L3. Since the width L2 of the slits 60uL, 60uR is formed narrower than the width L1 of the slits 60dL, 60dR, the length of the upper intermediate rib 62u is longer than that of the lower intermediate rib 62d due to the narrower width.

By providing multiple types of widths of the slits 60 according to the position and the size of the cable to be installed in this way, cables different in thickness can be held by one cable holding unit 6. When cables are held by the cable holding unit 6, the number of cables to be simultaneously held may be one or more. Moreover, though two slits 60 having the same width are arranged at each of upper side, lower side, and middle sides of the cable holding unit 6, the arrangement is not limited to this arrangement, but may vary according to the arrangement of cables. Moreover, the types of the cables are not limited to three, the types of the width may be changed according to the types of the cables when the number of types is two, three or more.

Figure 7:
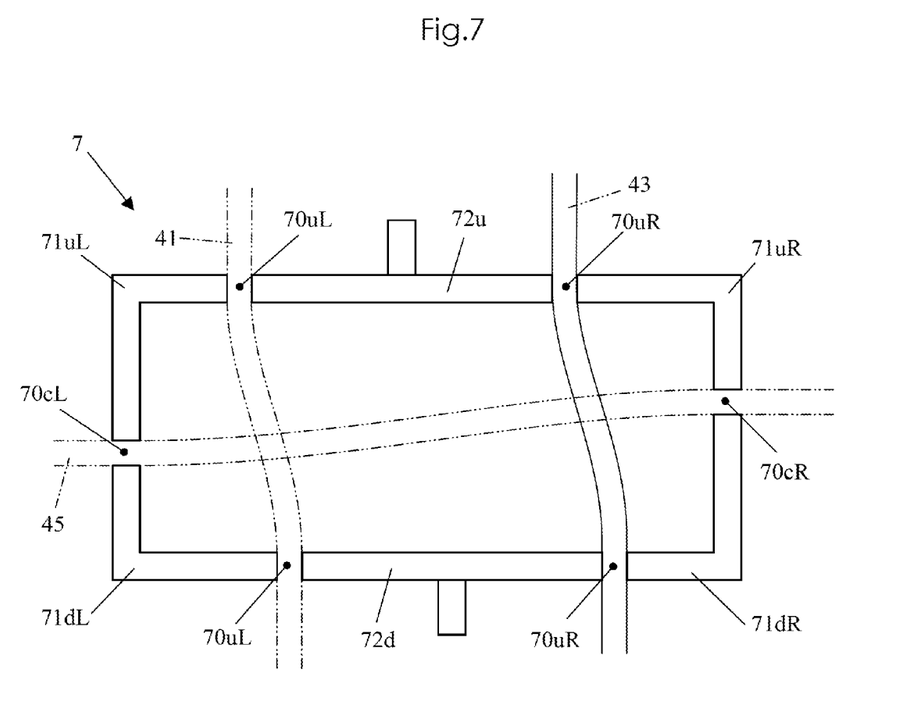
FIG. 7 shows another example of the cable holding structure according to the present invention.

A description will now be given of other examples of the cable holding structure according to the present invention referring to drawings. FIG. 7 shows another example of the cable holding structure according to the present invention. A cable holding unit 7 shown in FIG. 7 is formed so that the centers of opposed slits 70 in vertical and horizontal directions out of multiple formed slits 70 are displaced.

In other words, the center of the upper left slit 70uL formed on the left side of the upper intermediate rib 72u and the center of the lower left slit 70dL formed on the left side of the lower intermediate rib 72d are displaced in the horizontal direction in the drawing. Moreover, the center of the upper right slit 70uR formed on the right side of the upper intermediate rib 72u and the center of the lower right slit 70dR formed on the right side of the lower intermediate rib 72d are displaced in the horizontal direction in the drawing. Moreover, the center of the slit 70cL formed between the upper left corner rib 71uL and the lower left corner rib 71dL and the center of the slit 70cR formed between the upper right corner rib 71uR and the lower right corner rib 71dR are displaced in the vertical direction in the drawing.

The cable holding unit 7, like the cable holding unit 6, holds cables 41, 43, and 45 different in type. The cable holding unit 7 simultaneously holds the cable 41 provided for the board 32 on the upper side, and the cable 43 attached to the speaker 33 on the lower side during the transport of the front cabinet 3. Moreover, when the liquid crystal television receiver is finally assembled, the cable 45 to be connected to another device is held while these cables are removed or are still held. Though the respective cables 41, 43, and 45 are shown so as to have the same thickness for the sake of description in the cable holding unit 7 shown in FIG. 7, these cables may be different in thickness as shown in FIG. 6

The cable 41 is attached so as to pass the upper left slit 70uL and the lower left slit 70dL, and the cable 42 is attached so as to pass the lower right slit 70dR and the upper right slit 70uR. By attaching the cables to the slits arranged so as to be displaced in the horizontal direction in this way, the cable is caught by the corner rib and/or the intermediate rib when the cable is pulled in the axial direction. As a result, it is possible to restrain the cable from being pulled out. Moreover, a pulling force acting on the cable acts on the cable holding unit 7, and it is thus possible to prevent the pulling force from acting on a member (board and speaker) provided with the cable.

Moreover, since the cable 45 is similarly attached so as to pass the slit 70cL and the slit 70cR, the cable 45 is caught by the corner rib. As a result, it is possible to restrain the cable from being pulled out. Moreover, since a pulling force acting on the cable acts on the cable holding unit 7, it is possible to prevent the pulling force from acting on a member provided with the. The cable 45 may be attached to the cable holding unit 7 after the cable 41 and the cable 43 are removed, or may be attached so as to cross the cable 41 and/or the cable 43 (in the direction of the thickness of the page).

Though the upper slit is displaced leftward with respect to the lower slit on both the left and right sides in the cable holding unit 7 shown in FIG. 7, the displacement is not limited to this case, and may be displaced in the opposite way. Moreover, the upper left slit may be formed so as to be displaced rightward with respect to the lower left slit, and the upper right slit may be formed so as to be displaced leftward with respect to the lower right slit. It is possible to widely employ slits formed such that opposing ones are so displaced as to receive the pulling force by means of the cable holding unit 7. Moreover, all the opposing slits of the cable holding unit 7 may not be displaced. Moreover, only slits which hold a cable on which a force highly possibly acts in the axial direction of the cable may be formed to be displaced.

Figure 8A:
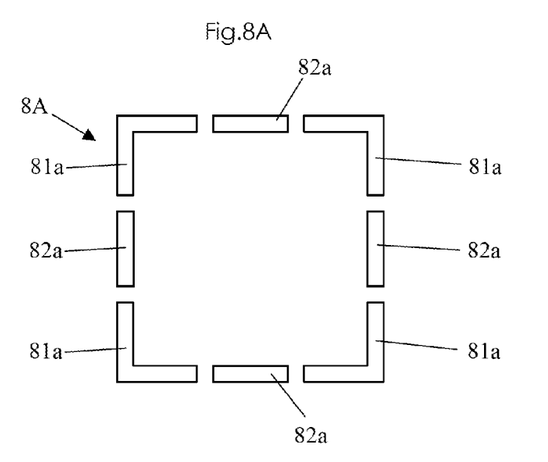
FIG. 8A is a schematic view showing another example of the cable holding structure.
Figure 8B:
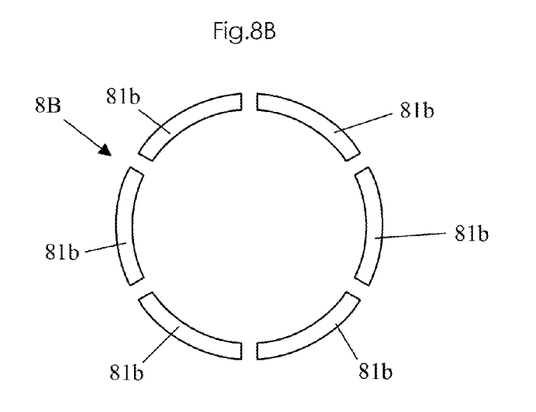
FIG. 8B is a schematic view showing another example of the cable holding structure.
Figure 8C:
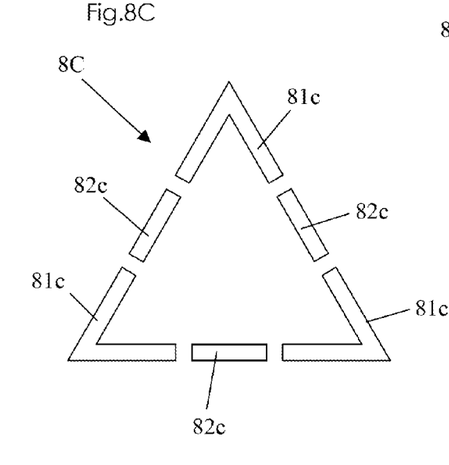
FIG. 8C is a schematic view showing another example of the cable holding structure.

A description will further be given of other examples of the cable holding structure according to the present invention referring to drawings. FIG. 8A to FIG. 8C are schematic diagrams showing a part of examples of the cable holding structures. A cable holding unit 8A is provided with two pairs of intermediate ribs as shown in FIG. 8A, namely, four corner fibs 81a, and two pairs of intermediate ribs 82a are arranged so that a center space forms a square in the cable holding unit 8A. By this arrangement, a cable can be properly engaged with slits independently of the position of the cable, resulting in high general versatility.

A description will now be given of another example of the cable holding unit referring to FIG. 8B. The cable holding unit 8b includes six curved ribs 81b in the same shape, and the curved ribs 81b are arranged so that an internal space forms a circle. By providing the cable holding unit 8B formed into the circular shape in this way, a cable can be properly fit into the slits independently of the position of the cable, resulting in a high general versatility.

Moreover, a description will be given of another example of the cable holding unit referring to FIG. 8C. The cable holding unit 8C shown in FIG. 8C is provided with three corner ribs 81c and three intermediate ribs 82c. The corner ribs 81c and the intermediate ribs 82c are alternately arranged so that a center space forms a triangular shape. By providing the cable holding unit 8C formed into the triangular shape in this way, a cable can be properly fit into the slits independently of the position of the cable, resulting in a high general versatility.

Though the description is given of the cases in which the ribs of the cable holding unit form the rectangular shape, the square shape, the circular shape, and the triangular shape as described above, the arrangement of the ribs is not limited to these cases, and arrangements in which a space surrounded by the ribs is formed at the center may be widely employed. When the shape formed by the ribs is too complex, sinks tend to occur on the surface of the front cabinet. Therefore, a shape which is not too closely-spaced and which has a sufficient strength is preferred.

The present invention can be used for a cable holding structure which holds wires arranged in a finished product of an electronic apparatus such as a liquid crystal television receiver using a LCD, and which holds wires provided for assembled parts during a transport in a semi-assembled state.

What is claimed is:

1. A cable holding structure for holding a cable arranged inside a housing of an electronic device, comprising:
    a plurality of ribs that are elected on an inner surface of the housing of the electronic device,
    wherein the plurality of ribs are arranged in a closed figure formed on the inner surface of the housing of the electronic device so that a gap between neighboring ribs has a predetermined width and at least one of the plurality of ribs is a corner or an arc of the closed figure.

2. The cable holding structure according to claim 1, wherein the closed figure includes at least one straight portion, comprising a reinforcement rib that is provided for at least a rib arranged on the straight portion out of the plurality of ribs, crosses an outer wall surface of the closed figure, and protrudes from the inner surface of the housing.

3. The cable holding structure according to claim 1, wherein the closed figure is a quadrangle, and the plurality of ribs include at least corner ribs arranged at four corners.

4. The cable holding structure according to claim 3, wherein the plurality of ribs include at least one intermediate rib arranged between the corner ribs.

5. The cable holding structure according to claim 4, wherein the quadrangle is a rectangle, comprising a pair of the intermediate ribs that are arranged at least on the longitudinal sides of the rectangle, and are formed to oppose each other.

6. The cable holding structure according to claim 3, wherein all the four corner ribs have the same shape.

7. The cable holding structure according to claim 1, wherein the closed figure is circular; and the plurality of ribs have the same shape, and are arranged on a same circumference at equal intervals in the circumferential direction.

8. The cable holding structure according to claim 1, wherein the plurality of ribs are configured so that the gap between neighboring ribs may have at least two types of widths.

9. A liquid crystal television receiver, wherein the cable holding structure according to claim 1 is provided on a front cabinet.

10. A cable holding method for holding a cable using the cable holding structure according to claim 1, wherein the cable is clamped and held in the gap formed between the plurality of ribs.

11. The cable holding method according to claim 10, wherein the cable is held along the ribs in a zigzag manner.

12. The cable holding method according to claim 10, wherein the cable is clamped in the gaps so that the cable is folded back outside the closed figure.

13. The cable holding method according to claim 10, wherein at least two cables are held simultaneously.

14. A cable holding method for holding a cable using the cable holding structure according to claim 1, wherein a bent portion is formed by bending the cable, and the bent portion is stored and held in a space surrounded by the plurality of ribs.

15. A cable holding method for holding a cable using the cable holding structure according to claim 1, wherein the cable is held by storing a connector provided at an end of the cable in a space surrounded by the plurality of ribs.

16. The cable holding method according to claim 15, wherein at least a part of the connector is disposed outside of the space surrounded by the plurality of ribs.

* * * * *